(12) United States Patent
Aleksov et al.

(10) Patent No.: US 8,434,668 B2
(45) Date of Patent: May 7, 2013

(54) MAGNETIC ATTACHMENT STRUCTURE

(75) Inventors: Aleksandar Aleksov, Chandler, AZ (US); Rajasekaran Swaminathan, Chandler, AZ (US); Ting Zhong, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 12/778,313

(22) Filed: May 12, 2010

(65) Prior Publication Data

US 2011/0278044 A1 Nov. 17, 2011

(51) Int. Cl.
*B23K 31/02* (2006.01)
*H01L 21/44* (2006.01)

(52) U.S. Cl.
USPC .............. 228/180.22; 228/180.21; 438/612; 438/613; 438/614

(58) Field of Classification Search .............. 228/180.21, 228/180.22; 438/612, 613, 614
See application file for complete search history.

(56) References Cited

U.S. PATENT DOCUMENTS

| | | | |
|---|---|---|---|
| 3,839,727 A | 10/1974 | Herdzik et al. | |
| 4,983,804 A * | 1/1991 | Chan et al. ............... | 219/616 |
| 5,048,744 A | 9/1991 | Chang et al. | |
| 5,093,545 A | 3/1992 | McGaffigan | |
| 5,346,775 A | 9/1994 | Jin et al. | |
| 5,353,498 A | 10/1994 | Fillion et al. | |
| 5,497,033 A | 3/1996 | Fillion et al. | |
| 5,527,741 A | 6/1996 | Cole et al. | |
| 5,838,069 A | 11/1998 | Itai et al. | |
| 5,841,193 A | 11/1998 | Eichelberger | |
| 5,846,366 A | 12/1998 | Jin et al. | |
| 5,907,786 A | 5/1999 | Shinomiya | |
| 6,154,366 A | 11/2000 | Ma et al. | |
| 6,159,767 A | 12/2000 | Eichelberger | |
| 6,174,797 B1 | 1/2001 | Bao et al. | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,454,159 B1 | 9/2002 | Takushima | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |

(Continued)

OTHER PUBLICATIONS

Habib, et al., "Novel Solder-Magnetic Particle Composites and Their Reflow Using AC Magnetic Fields", IEEE Transactions on Magnetics, vol. 46, No. 6, Jun. 2010, pp. 1-4.

(Continued)

*Primary Examiner* — Devang R Patel
(74) *Attorney, Agent, or Firm* — Winkle, PLLC

(57) ABSTRACT

The present disclosure relates to the field of fabricating microelectronic packages, wherein components of the microelectronic packages may have magnetic attachment structures comprising a magnetic component and a metal component. The magnetic attachment structure may be exposed to a magnetic field, which, through the vibration of the magnetic component, can heat the magnetic attachment structure, and which when placed in contact with a solder material can reflow the solder material and attach microelectronic components of the microelectronic package.

16 Claims, 11 Drawing Sheets

U.S. PATENT DOCUMENTS

| | | |
|---|---|---|
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,642,485 B2 | 11/2003 | Goenka et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,213,329 B2 | 5/2007 | Kim et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,902,060 B2 | 3/2011 | Swaminathan |
| 8,188,581 B2 * | 5/2012 | Shi et al. ............ 257/673 |
| 2002/0185309 A1 | 12/2002 | Imamura et al. |
| 2004/0013860 A1 | 1/2004 | Sumi et al. |
| 2007/0231961 A1 | 10/2007 | Teshirogi et al. |
| 2008/0048009 A1 | 2/2008 | Maeda et al. |
| 2008/0054448 A1 | 3/2008 | Lu et al. |
| 2008/0165518 A1 | 7/2008 | Ichiryu et al. |
| 2008/0283387 A1 | 11/2008 | Rice et al. |
| 2008/0315377 A1 | 12/2008 | Eichelberger et al. |
| 2008/0315391 A1 | 12/2008 | Kohl et al. |
| 2009/0027857 A1 | 1/2009 | Dean et al. |
| 2009/0072012 A1 | 3/2009 | Sakaguchi et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0166396 A1 | 7/2009 | Supriya et al. |
| 2009/0212416 A1 | 8/2009 | Skeete |
| 2009/0294942 A1 | 12/2009 | Palmer et al. |
| 2009/0301769 A1 | 12/2009 | Seppä et al. |
| 2010/0044855 A1 | 2/2010 | Eichelberger et al. |
| 2010/0047970 A1 | 2/2010 | Eichelberger et al. |
| 2010/0159692 A1 | 6/2010 | Swaminathan |
| 2010/0282823 A1 | 11/2010 | Ulicny et al. |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0215464 A1 | 9/2011 | Guzek et al. |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0266030 A1 | 11/2011 | Swaminathan et al. |
| 2011/0278351 A1 * | 11/2011 | Aleksov et al. ............ 228/234.1 |
| 2011/0281375 A1 | 11/2011 | Swaminathan et al. |
| 2011/0291276 A1 | 12/2011 | Swaminathan et al. |
| 2012/0001339 A1 | 1/2012 | Malatkar |
| 2012/0009738 A1 | 1/2012 | Crawford et al. |
| 2012/0049382 A1 | 3/2012 | Malatkar |

OTHER PUBLICATIONS

"Yale Scientists Develop Magnetic Lead-free Solder", SMT Magazine Archive, Mar. 8, 2010, Retrieved on Dec. 6, 2010, Document Available at: <http://www.ems007.com/pages/zone.cgi?a=60208&artpg=1>, 2 pages.

Calabro, Joshua D., et al. "Magnetically Driven Three-Dimensional Manipulation and Inductive Heating of Magnetic-Dispersion Containing Metal Alloys", Department of Mechanical Engineering, Yale University, New Haven, CT 06520; and Department of Materials Science and Engineering, Massachusetts Institute of Technology, Cambridge, PNAS, Mar. 16, 2010, vol. 107 No. 11 pp. 4834-4839.

McCormack, M. et al., "Enhanced Solder Alloy Performance by Magnetic Dispersions", IEEE Transactions on Components, Packaging, and Manufacturing Technology-Part A, vol. 17, No. 3, Sep. 1994, pp. 452-457.

Suwanwatana, W. et al., "Influence of particle size on hysteresis heating behavior of nickel particulate polymer films", Elsevier, Composites Science and Technology 66, May 30, 2006, pp. 2825-2836.

U.S. Appl. No. 12/787,968, filed May 26, 2010, 29 pages.
U.S. Appl. No. 12/778,335, filed May 12, 2010, 43 pages.
U.S. Appl. No. 12/777,476, filed May 11, 2010, 41 pages.
U.S. Appl. No. 12/768,842, filed Apr. 28, 2010, 33 pages.
U.S. Appl. No. 12/655,335, filed Dec. 29, 2009, 36 pages.
U.S. Appl. No. 12/761,782, filed Apr. 16, 2010, 29 pages.
U.S. Appl. No. 12/755,183, filed Apr. 6, 2010, 21 pages.
U.S. Appl. No. 12/755,201, filed Apr. 6, 2010, 23 pages.
U.S. Appl. No. 12/725,925, filed Mar. 17, 2010, 34 pages.
U.S. Appl. No. 12/753,637, filed Apr. 2, 2010, 34 pages.
U.S. Appl. No. 09/640,961, filed Aug. 16, 2000, 70 Pages.
Office Action received for U.S. Appl. No. 12/343,341, mailed on Sep. 15, 2010, 9 pages.
U.S. Appl. No. 12/827,323, filed Jun. 30, 2010, 28 pages.
U.S. Appl. No. 12/868,816, filed Aug. 26, 2010, 23 pages.
U.S. Appl. No. 12/830,875, filed Jul. 6, 2010, 41 pages.

* cited by examiner

MAGNETIC ATTACHMENT STRUCTURE

BACKGROUND

A typical microelectronic package includes at least one microelectronic die that is mounted on a substrate such that bond pads on the microelectronic die are attached directly to corresponding bond lands on the substrate using reflowable solder materials.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
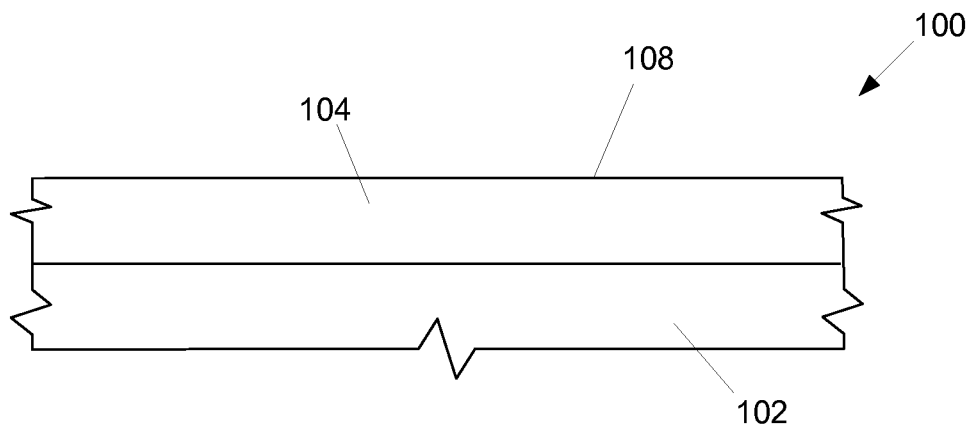
FIGS. 1-4 illustrate side cross-sectional views of a process of forming a dispersed magnetic attachment structure.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein components of the microelectronic packages may have magnetic attachment structures comprising a magnetic component and a metal component. The magnetic attachment structure may be exposed to a magnetic field, which, through the vibration of the magnetic component, can heat the magnetic attachment structure, and which when placed in contact with a solder material can reflow the solder material and attach microelectronic components of the microelectronic package.

In the production of microelectronic packages, microelectronic dice are generally mounted on substrates that may, in turn, be mounted to boards, which provide electrical communication routes between the microelectronic dice and external components. A microelectronic die, such as a microprocessor, a chipset, a graphics device, a wireless device, a memory device, an application specific integrated circuit, or the like, may be attached to a substrate, such as an interposer, a motherboard, and the like, through a plurality of interconnects, such as reflowable solder bumps or balls, in a configuration generally known as a flip-chip or controlled collapse chip connection ("C4") configuration. When the microelectronic die is attached to the substrate with interconnects made of solder, the solder is reflowed (i.e. heated) to secure the solder between the microelectronic die bond pads and the substrate bond pads.

During such an attachment, a thermal expansion mismatch may occur between the microelectronic die and the substrate as the solder is heated to a reflow temperature and subsequently cooled after the attachment. This thermal expansion mismatch can warp the microelectronic package, as well as result in significant yield losses and failures due to, for example, stretched joint formation, solder bump cracking, under bump metallization failures, edge failures, and layer separation within the substrates and microelectronic dice, as will be understood to those skilled in the art.

FIG. 1 shows a microelectronic device 100, which may be a microelectronic die, including, but not limit to microprocessor, a chipset, a graphics device, a wireless device, a memory device, an application specific integrated circuit, or the like. The microelectronic device 100 may comprise a microelectronic substrate 102, such as an amorphous silicon or a silicon-germanium wafer, having an interconnect layer 104 formed thereon. The interconnect layer 104 may be a plurality of dielectric layers (not shown) having conductive traces (not shown) formed thereon and therethrough. The interconnect layer 104 forms conductive routes from integrated circuits (not shown) formed in and on the microelectronic substrate 102 to at least one conductive land (not shown) formed proximate an outer surface 108 of the interconnect layer 104.

The plurality of dielectric layers of the interconnect layer 104 may be any appropriate dielectric material, including but not limited to a silicon oxide, silicon nitride, and low-K dielectric materials (i.e. dielectric materials with a dielectric constant "K" lower than that of silicon oxide), including but not limited to carbon doped silicon dioxide and fluorine doped silicon dioxide. The plurality of conductive traces of the interconnect layer 104 may be any appropriate electrically conductive material, including but not limited to copper, aluminum, silver, gold, or alloys thereof.

Figure 2:
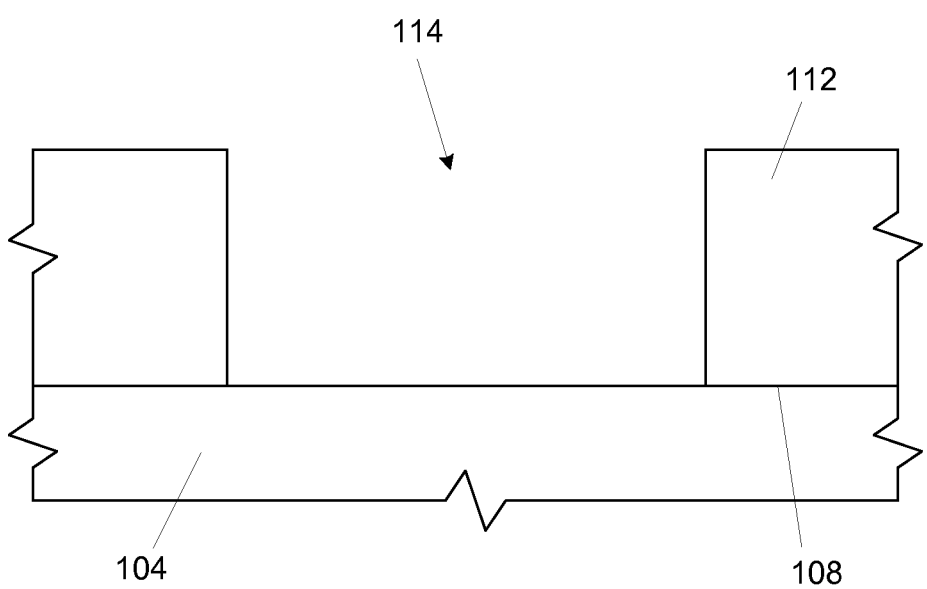

FIG. 2 illustrates a closer view of the interconnect layer 104 of FIG. 1, which may have a mask 112 patterned on the interconnect layer outer surface 108. The mask 112 may have an opening 114 extending therethrough to expose a portion of the microelectronic substrate interconnect layer 104. In one embodiment, the mask 112 may be a photoresist material, which may be patterned by lithographic techniques known in the art.

Figure 3:
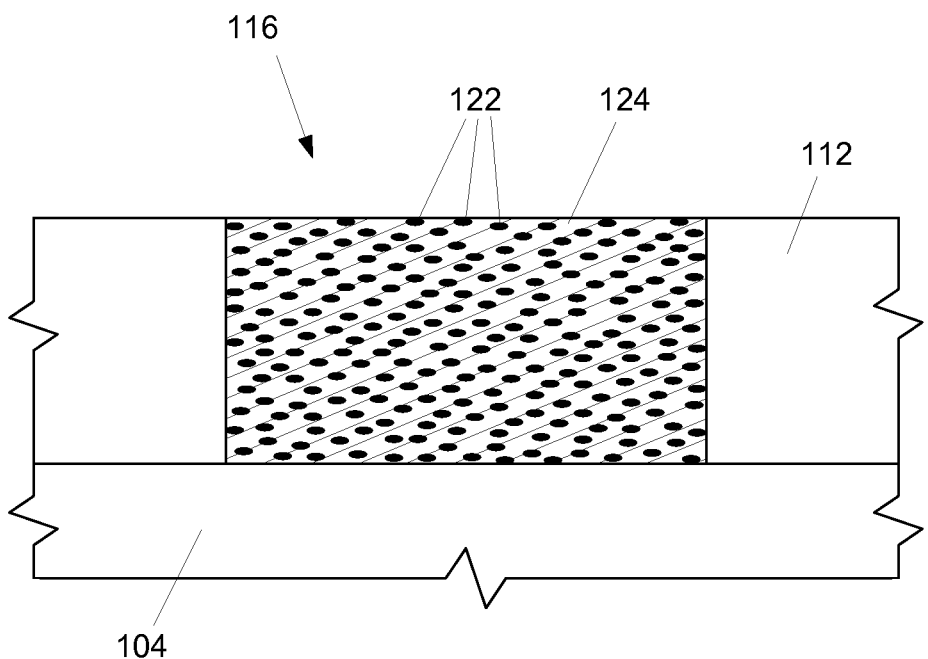

As shown in FIG. 3, the interconnect layer outer surface 108 may be plated with a magnetic conductive material 116 (which may make contact with a conductive land (not shown) of the interconnect layer 104) through the mask opening 114 (see FIG. 2). The magnetic conductive material 116 may comprise a metal component 122 and a magnetic component 124 dispersed therein. The magnetic conductive material 116 may be plated by any technique known in the art, including but not limited to electroplating and electroless plating. Additionally, the magnetic conductive material 116 may be deposited by various deposition techniques, such as sputtering.

In one embodiment, the metal component 122 may be copper or alloys thereof. The magnetic component 124 may include any magnetic material that is capable of being plated, including, but are not limited to, iron (Fe), cobalt (Co), nickel (Ni), and their respective alloys.

In one embodiment, the magnetic conductive material 116 may contain between about 1% and 50% by weight of the magnetic component 124. In a more specific embodiment, the magnetic conductive material 116 may contain between about 1% and 25% by weight of the magnetic component 124. In one embodiment, the magnetic conductive material 116 may have magnetic components 124 which are substantially all single domain particles. In another embodiment, the magnetic conductive material 116 may have magnetic components 124 sized between about 5 and 100 nm in length. In general, the content of magnetic component 124 within the metal component 122 should be sufficiently high enough to allow for efficient heating (as will be discussed), but sufficiently low enough to allow for efficient electrical conduction, as will be understood to those skilled in the art.

Figure 4:
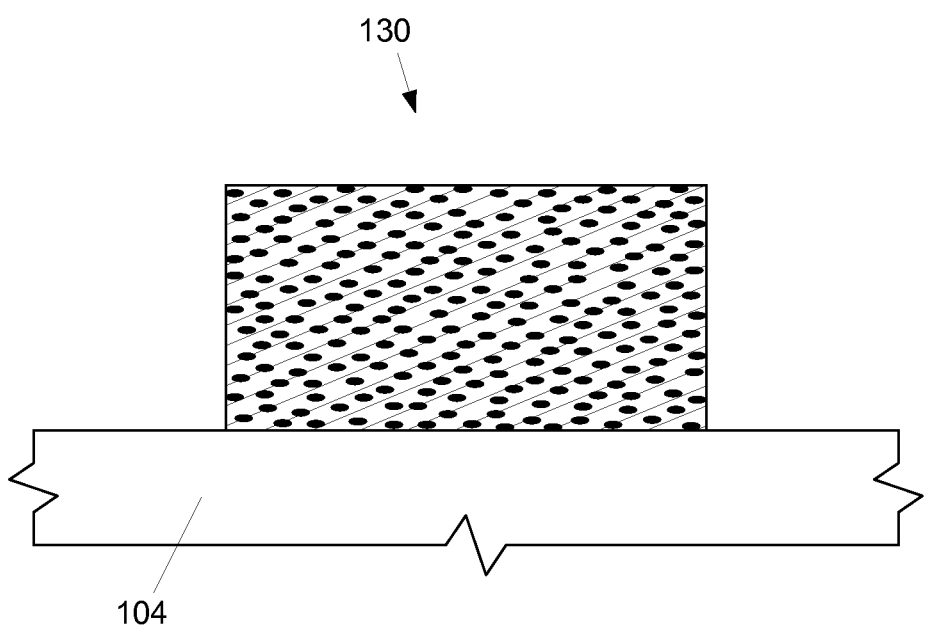

After the plating of the magnetic conductive material 116, the mask 112 may then be removed, thereby forming a dispersed magnetic attachment structure 130, as shown in FIG. 4.

Figure 5:
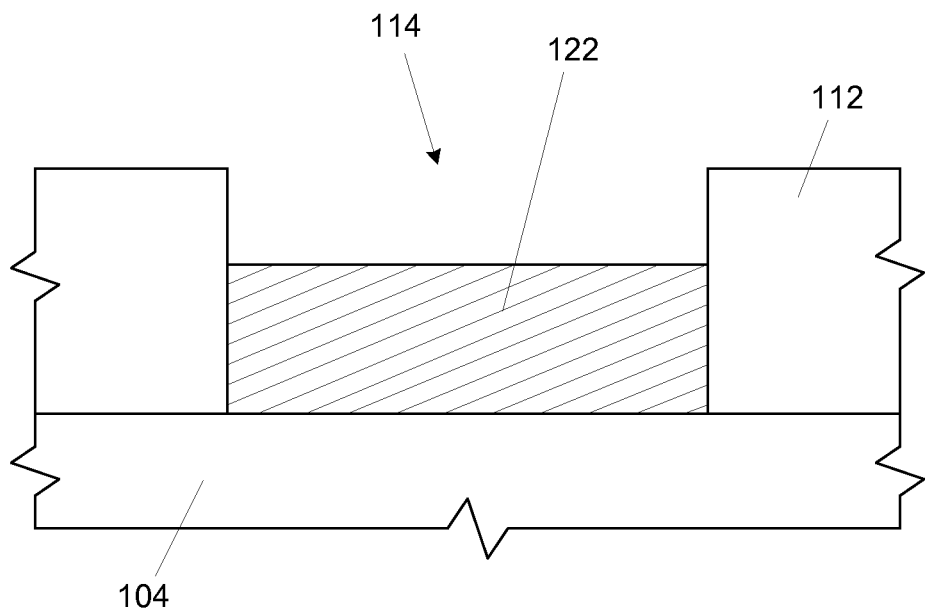
FIGS. 5-7 illustrate side cross-sectional views of a process of forming a layered dispersed magnetic attachment structure.
Figure 6:
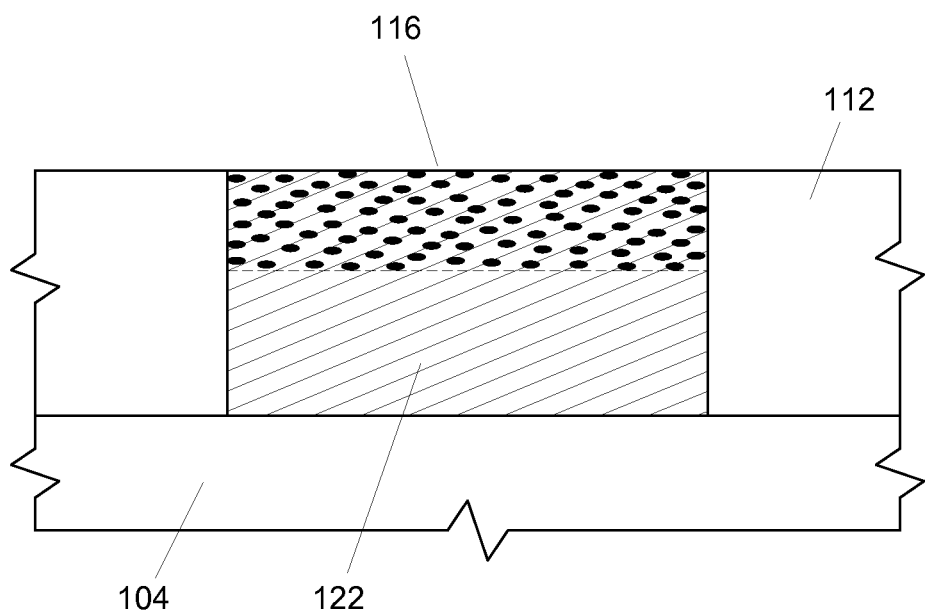
Figure 7:
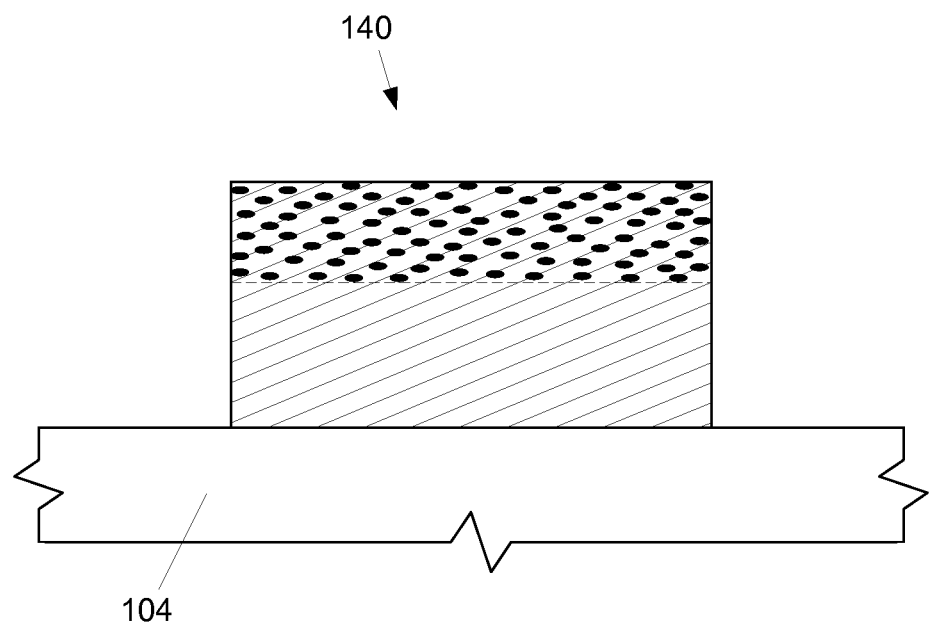

FIGS. 5-7 illustrate another embodiment of fabricating a magnetic attachment structure. Beginning with FIG. 2, the metal component 122 may be deposited on the interconnect layer 104 within the mask opening 114, as shown in FIG. 5. The magnetic conductive material 116 may be deposited on the metal component 122, as shown in FIG. 6. As previously discussed, the magnetic conductive material 116 may comprise the metal component 122 and the magnetic component 124 dispersed therein. The metal component 122 and the magnetic conductive material 116 may be plated by any technique known in the art, including but not limited to electroplating and electroless plating. Additionally, the metal component 122 and the magnetic conductive material 116 may be deposited by various deposition techniques, such as sputtering. The mask 112 may then be removed, thereby forming a dispersed layered magnetic attachment structure 140, as shown in FIG. 7. The dispersed layered magnetic attachment structure 140 comprises the magnetic component 124 dispersed within a portion of the metal component 122.

Figure 8:
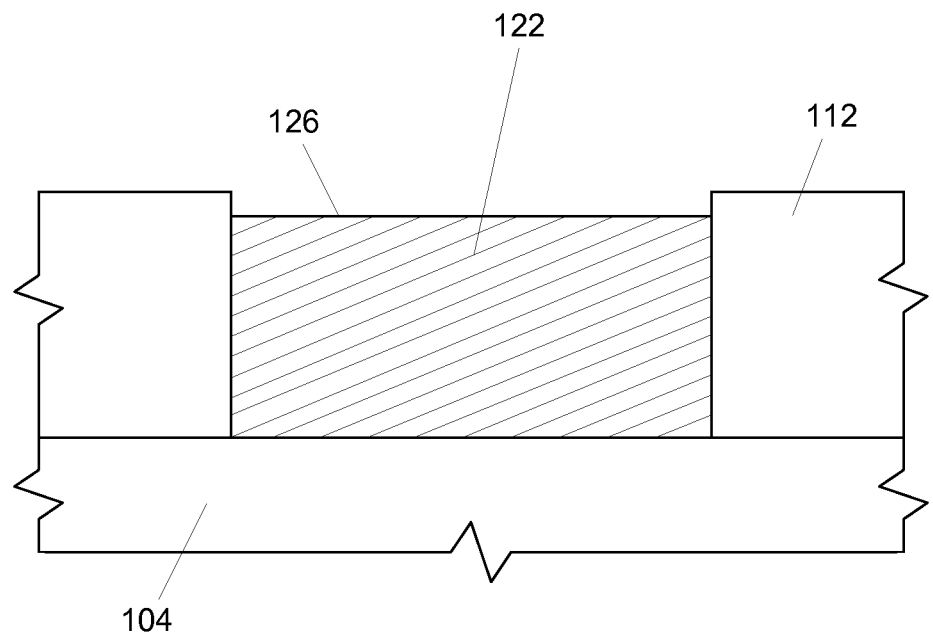
FIGS. 8-10 illustrate side cross-sectional views of a process of forming layered magnetic attachment structure.
Figure 9:
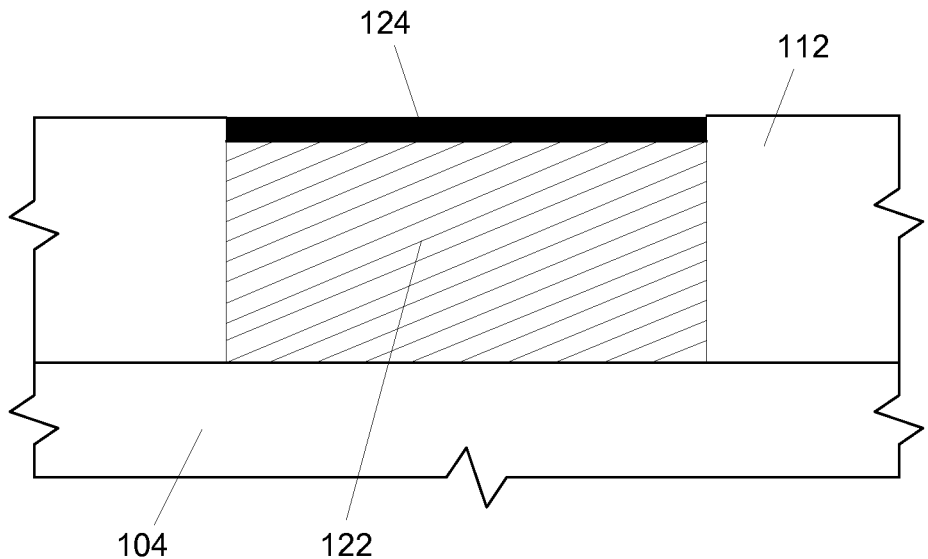
Figure 10:
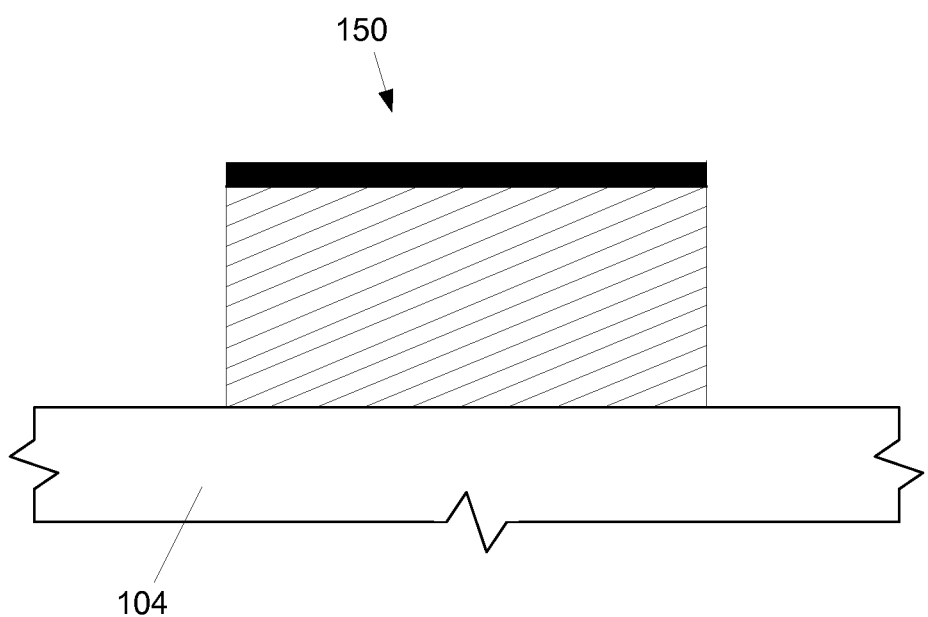

FIGS. 8-10 illustrate still another embodiment of fabricating a magnetic attachment structure. Beginning with FIG. 2, the metal component 122 may be deposited on the interconnect layer 104 within the mask opening 114, as shown in FIG. 8. A magnetic component 124 may be deposited on a top surface 126 of the metal component 122, as shown in FIG. 9. The magnetic component 124 may be plated by any technique known in the art, including but not limited to electroplating and electroless plating. Additionally, the magnetic component 124 may be deposited by various deposition techniques, such as sputtering. The mask 112 may then be removed, thereby forming a layered magnetic attachment structure 150, as shown in FIG. 10.

Figure 11:
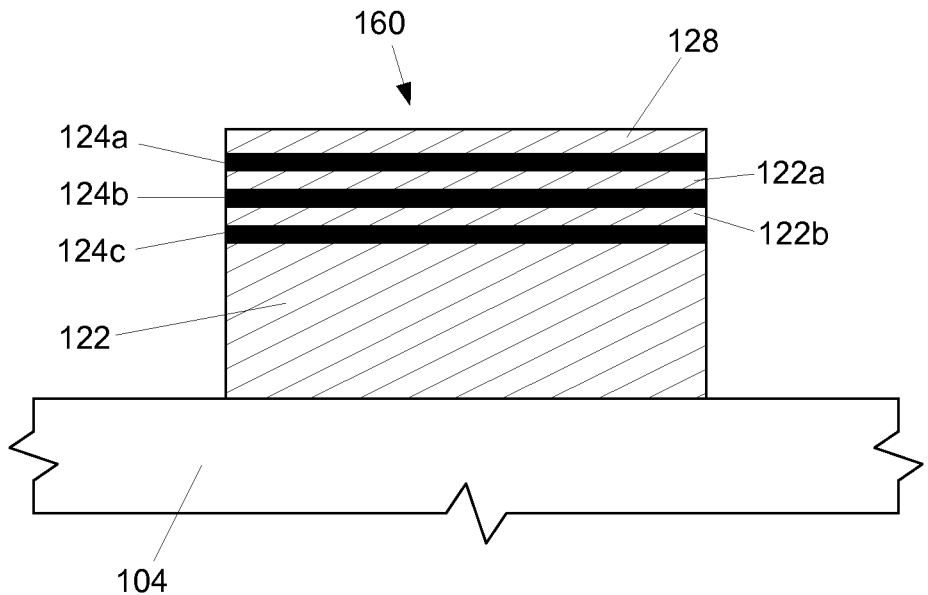
FIG. 11 illustrates a side cross-sectional view of a multi-layered magnetic attachment structure.

It is, of course, understood that the magnetic component 124 could be plated in multiple layers 124a, 124b, and 124c, with metal component layers 122a and 122b therebetween, to form a multi-layered magnetic attachment structure 160, as shown in FIG. 11, as will be understood to those skilled in the art. Both the layered magnetic attachment structure 150 and the multi-layered magnetic attachment structure 160 may have a metal component cap 128 (shown in FIG. 11) deposited thereon. The thickness of the magnetic component 124, 124a, 124b, and 124c of FIGS. 10 and 11 may range from about 10 um to 10 nm.

Figure 12:
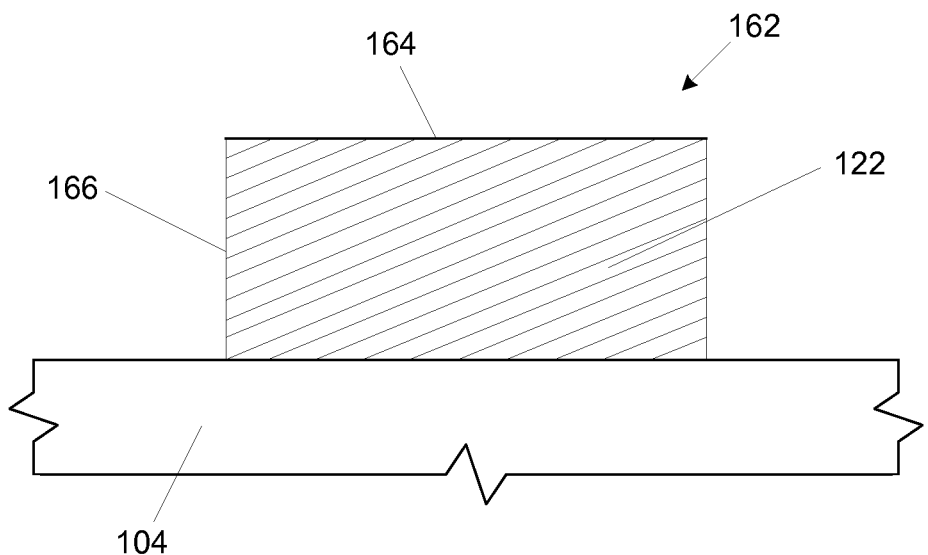
FIGS. 12 and 13 illustrate side cross-sectional views of a process of forming a layered magnetic attachment structure.
Figure 13:
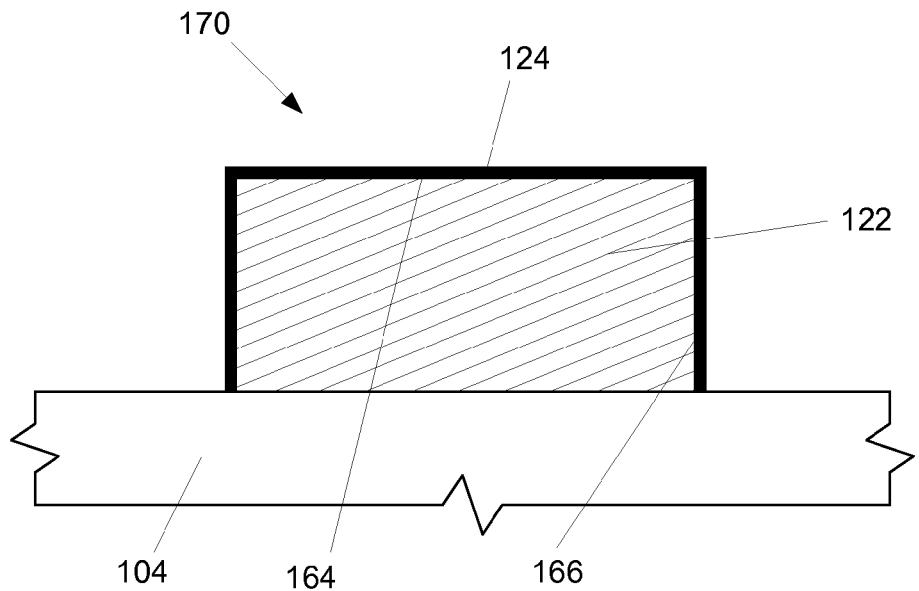
Figure 14:
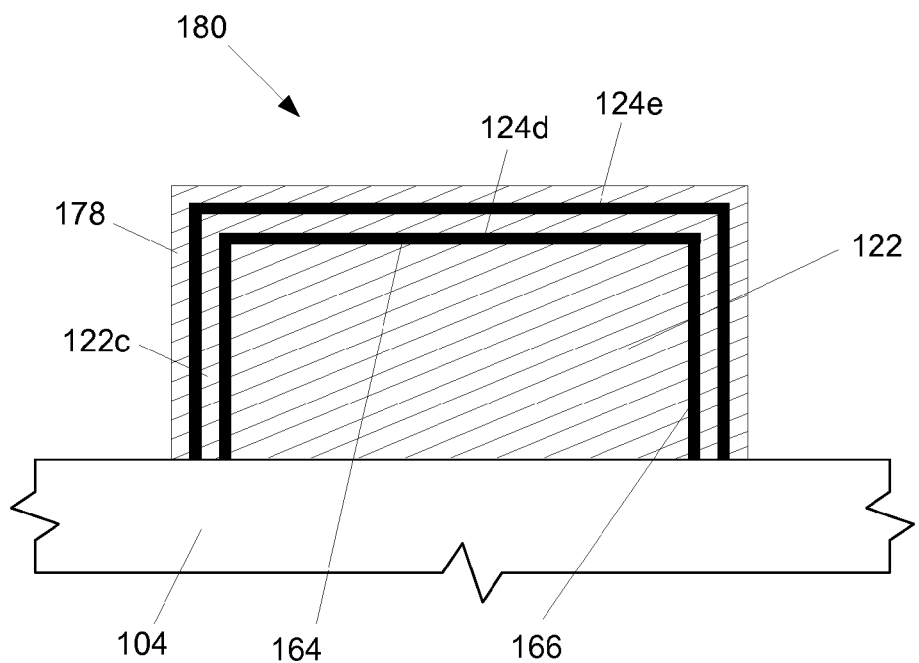
FIG. 14 illustrates a side cross-sectional view of a multi-layered magnetic attachment structure.

FIGS. 12-14 illustrate still another embodiment of fabrication a magnetic attachment structure. Beginning with FIG. 9, the mask 112 may be removed to form the metal component 122 as a conductive bump 162 having a top surface 164 and at least one sidewall 166, as shown in FIG. 12. The conductive bump top surface 164 and the conductive bump sidewall(s) 166 may be plated with the magnetic component 124, thereby forming a plated magnetic attachment structure 170, as shown in FIG. 13. It is, of course, understood that the magnetic component 124 could be plated in multiple plating layers 124d and 123e with metal component 122c layered between, to form a multi-plated magnetic attachment structure 180, as shown in FIG. 14. Both the plated magnetic attachment structure 170 and the multi-plated magnetic attachment structure 180 may have a metal component cap 178 (shown in FIG. 14) deposited thereon. The thickness of the magnetic component 124, 124d, and 124e of FIGS. 13 and 14 may range from about 10 um to 10 nm.

Any of the magnetic attachment structures (i.e. dispersed magnetic attachment structure 130, dispersed layered magnetic attachment structure 140, layer magnetic attachment structure 150, multi-layered magnetic attachment structure 160, plated magnetic attachment structure 170, and multi-plated magnetic attachment structure 180, hereinafter collectively referred to as magnetic attachment structure 190) may be used to attach microelectronic devices or components to one another.

Figure 15:
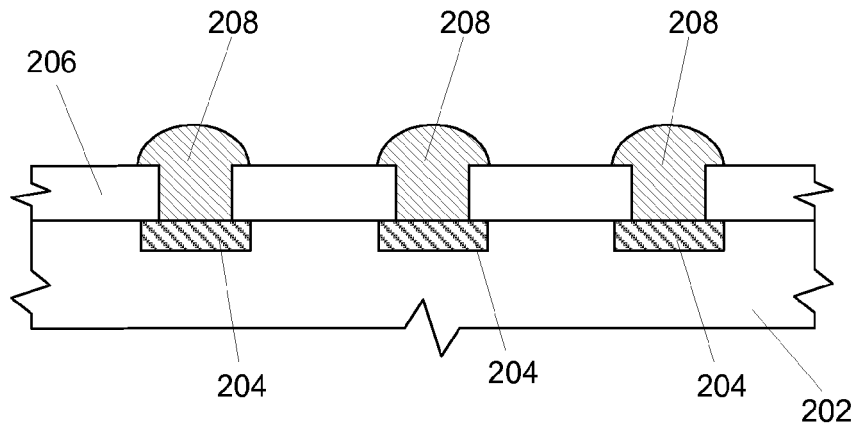
FIGS. 15-18 illustrate side cross-sectional views of attaching a microelectronic device to a substrate.

As shown in FIG. 15, a substrate 202, such as an interposer or a printed circuit board, may be provided having at least one attachment structure, such as bond pads 204, formed therein. The substrate 202 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The substrate bond pads 204 may be composed of any conductive metal, including but not limited to, copper, aluminum, and alloys thereof. The substrate bond pads 204 may be in electrical communication with conductive traces (not shown) within the substrate 202.

An outer dielectric layer 206 may be formed adjacent the substrate 202 and the substrate bond pads 204. The outer dielectric layer 206 may be a solder resist material, including but not limited to epoxy and epoxy-acrylate resins. The substrate 202, substrate bond pad 204, and the outer dielectric layer 206 may be formed by any known techniques, as will be understood by those skilled in the art.

At least one solder interconnect bump 208 can be formed through an opening in the outer dielectric material 206, by any known techniques, including but not limited to printing and spraying. The solder interconnect bumps 208 may be any appropriate material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. A pattern or distribution of the substrate interconnect bumps 208 may be a substantial mirror-image to the pattern or distribution of the magnetic attachment structures 190.

Figure 16:
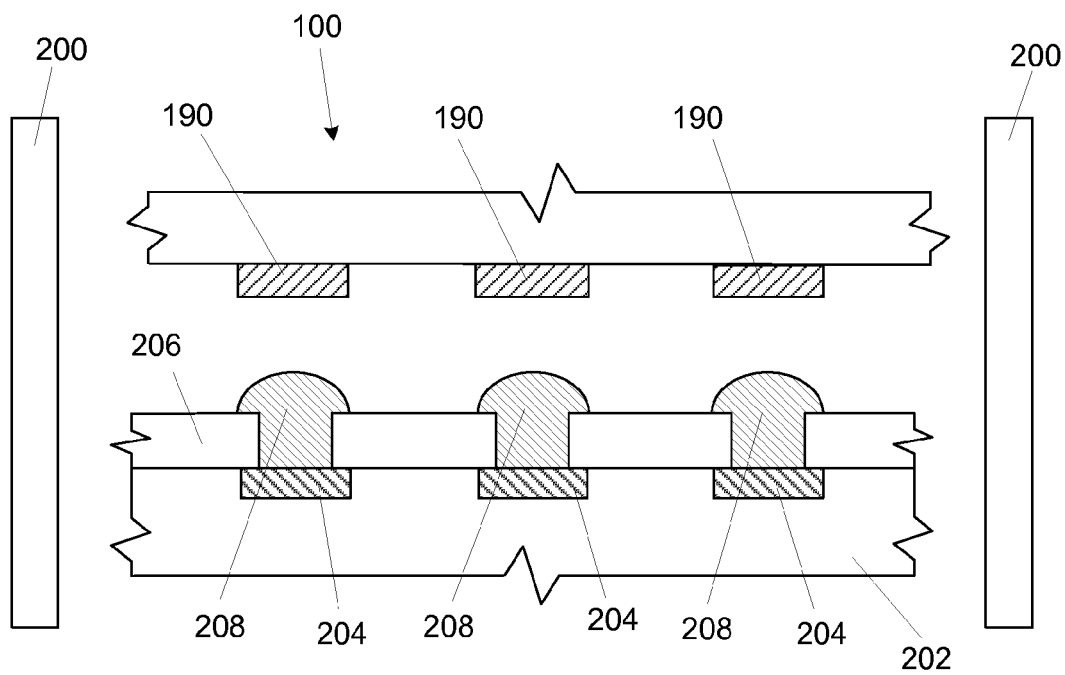

A magnetic field generator 200 and the microelectronic device 100 having a plurality of magnetic attachment structures 190 may be placed proximate the substrate 202, as shown in FIG. 16. In the presence of alternating current magnetic fields generated by the magnetic field generator 200, the magnetic material of the magnetic attachment structures 190 will generate heat by relaxational and hysteretic loss modes. Relaxational losses occur in single domain magnetic particles and they release heat when the magnetic moment of the particle rotates with the applied magnetic field (Neel motion) and when the particle itself rotates due to Brownian motion. Hystereis losses occur in multi-domain particles, and generate heat due to the various magnetic moments (due to multi-domains) rotating against the applied magnetic field. These losses occur with every cycle in the alternating current field, and the net heat generated increases with increasing number of field cycles. The various factors controlling heating rates may include, but are not necessarily limited to, magnetic particle size and size distribution, magnetic particle volume fractions (heat generation scales substantially linearly with volume fraction), magnetic material choice, shape anisotropy of the magnetic particles, and the applied frequency and amplitude of the alternating current used in the magnetic field generator 200. Therefore, when an alternating current magnetic field is applied by the magnetic field generator 200, the magnetic material within or on the magnetic attachment structures 190 essentially vibrates and heats up to at least the reflow temperature of the solder interconnect bump 208.

Figure 17:
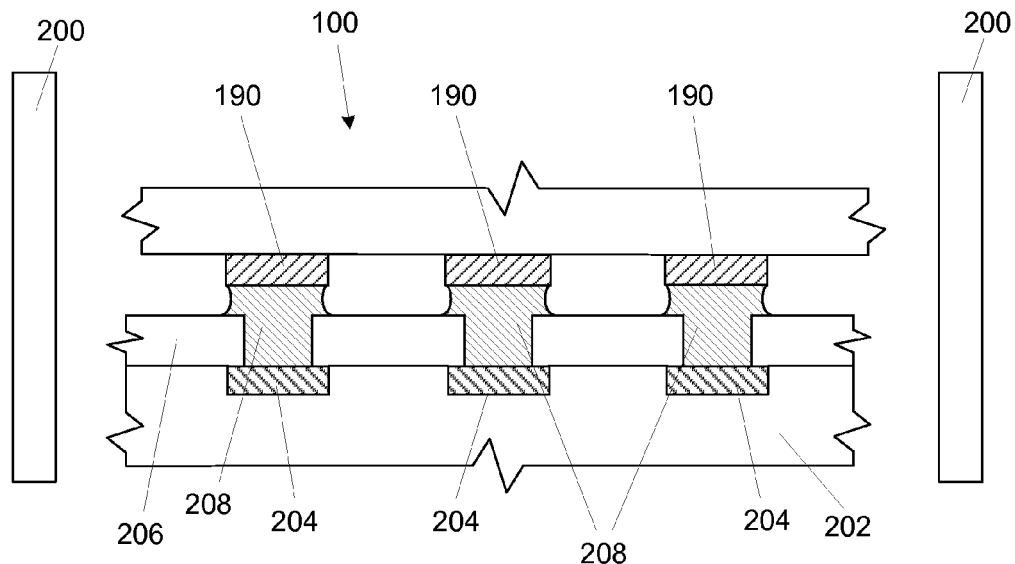
Figure 18:
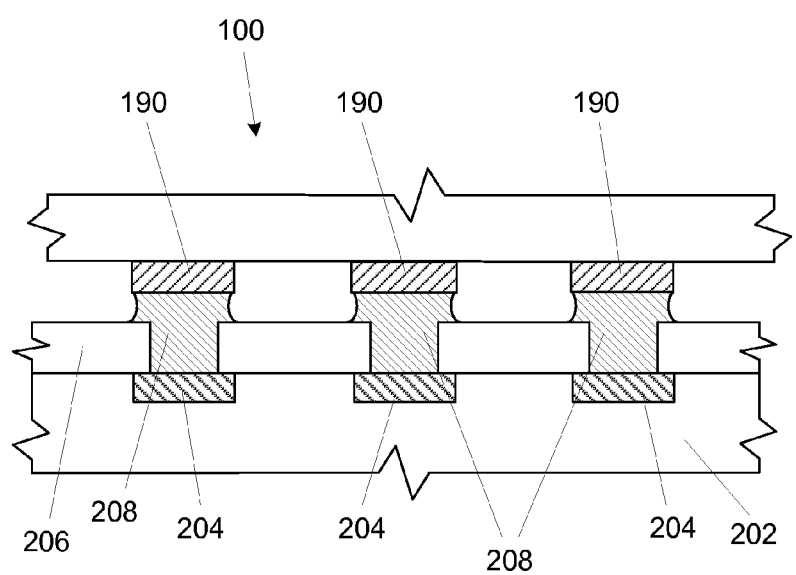

As shown in FIG. 17, the magnetic attachment structures 190 may be brought into contact with their respective solder interconnect bumps 208. The heat of the magnetic attachment structures 190 reflow at least a portion of the solder interconnect bumps 208 as they make contact. The magnetic field generator 200 may then be deactivated, or the substrate 202 and the attached microelectronic device 100 may be removed from the magnetic field, which allows the solder interconnect bumps 208 to cool and re-solidify to form an interconnection between the solder interconnect bumps 208 and the magnetic attachment structures 190, as shown in FIG. 18.

Since heating the solder interconnect bumps 208 to a reflow temperature during attachment to the microelectronic device 100 is localized to the magnetic attachment structures 190, other components (layer, traces, and the like) in the substrate 100 are only minimally heated up relative to external heating techniques. Thus, the magnetic heating of the present disclosure may minimize stresses due to thermal expansion mismatch.

Although the described embodiments within this description are directed to the substrate 102 and the microelectronic device 100, it is understood that the concepts apply equally to any microelectronic packaging process, including but not limited to First Level Interconnects (FLI) where microelectronic dice are attached to substrates or interposers, to Second Level Interconnects (SLI) where substrates or interposers are attached to a board or a motherboard, and to Direct Chip Attach (DCA) where microelectronic dice are attached directly to a board or a motherboard.

It is also understood that the subject matter of the present description is not necessarily limited to specific applications illustrated in FIGS. 1-18. The subject matter may be applied to other solder attachment processes in the fabrication of microelectronic devices, including, but not limited to, attachment of devices to a motherboard, attachment of integrated heat spreaders, and the like. Furthermore, the subject matter may also be used in any appropriate solder attachment application outside of the microelectronic device fabrication field.

Figure 19:
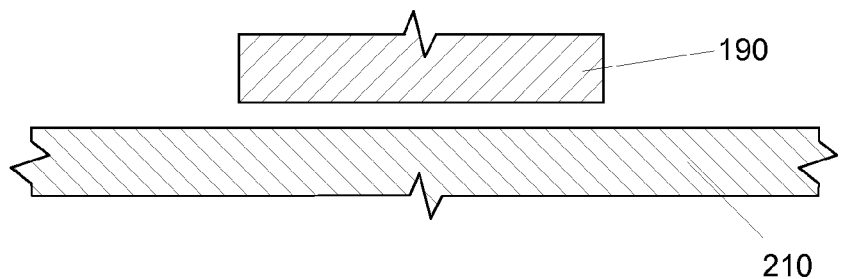
FIGS. 19-21 illustrate side cross-section views of a process of attaching a magnetic attachment structure to a solder material.
Figure 20:
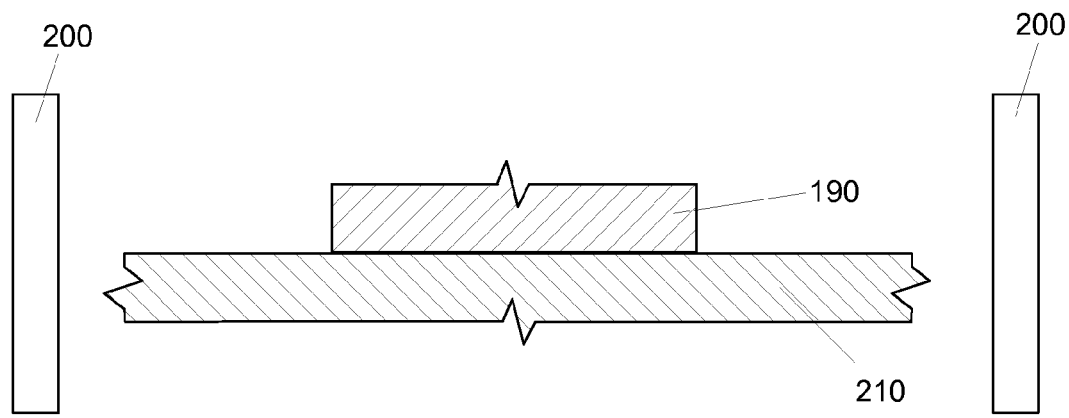
Figure 21:
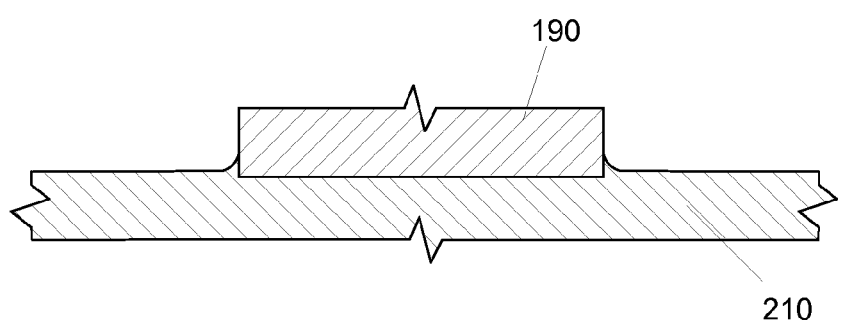
Figure 22:
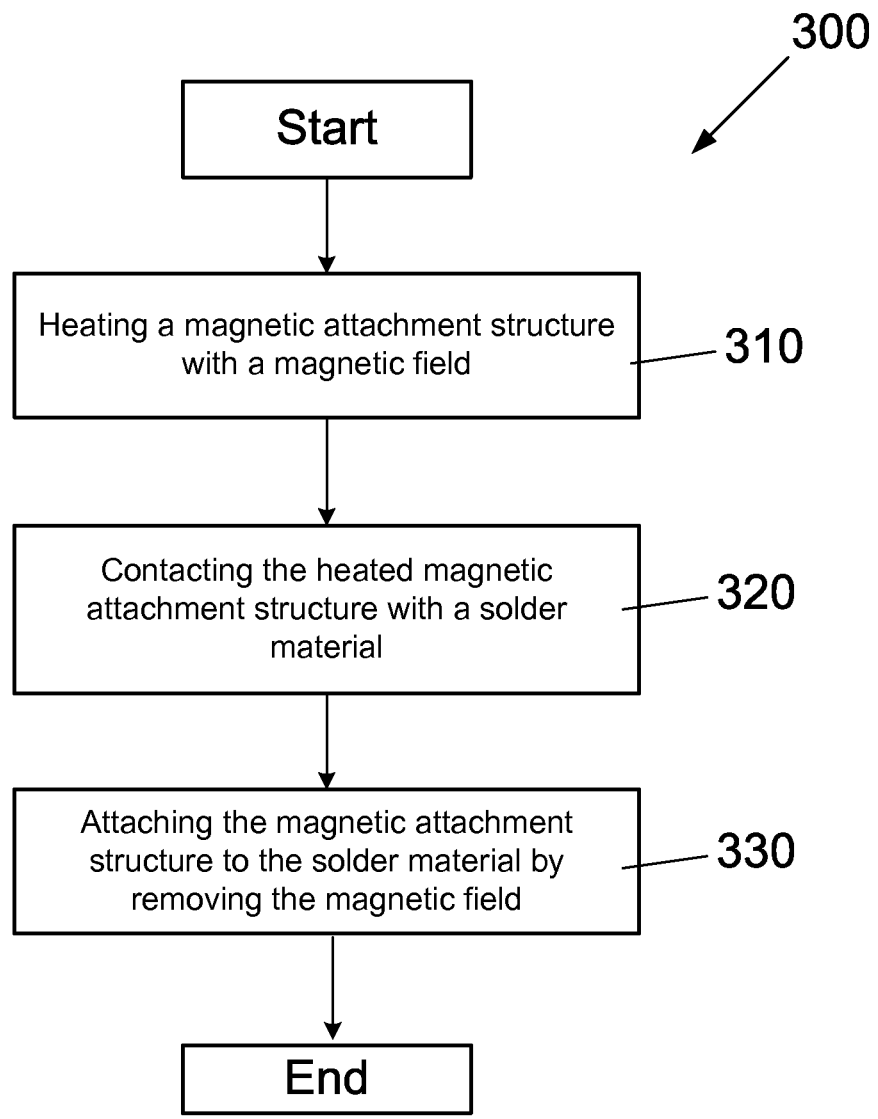
FIG. 22 is a flow diagram of a process of attaching a magnetic attachment structure to a solder material.

An embodiment of a process of the present description is illustrated in FIGS. 19-21 and in the flow diagram 300 of FIG. 22. As shown in FIG. 19 and defined in block 310 of FIG. 22, a magnetic attachment structure 190 may be heated in the magnetic field formed by the magnetic field generator 200. The heated magnetic attachment structure 190 may be brought into contact with a solder material 210, such as described for the solder interconnect bumps 208, as shown in FIG. 20 and defined in block 320 of FIG. 22. As shown in FIG. 21 and defined in block 330 of FIG. 22, the magnetic attachment structure 190 may be attached to the solder material 210 by removing the magnetic field.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of forming an interconnection, comprising:
    forming a magnetic attachment structure comprising forming a metal component and plating alternating layers of a magnetic component and metal component layers on a top surface of the metal component;
    heating the magnetic attachment structure in a magnetic field; contacting a solder material with the heated magnetic attachment structure; and
    attaching the magnetic attachment structure to the solder material by removing the magnetic field.

2. The method of claim 1, wherein heating the magnetic attachment structure comprises heating the magnetic attachment structure with an alternating current magnetic field imparted on the magnetic attachment structure.

3. The method of claim 1, wherein heating the magnetic attachment structure comprises heating the magnetic attachment structure to at least a reflow temperature of the solder material.

4. The method of claim 1, wherein plating the magnetic component on at least one surface of the metal component comprises plating a magnetic component comprising iron, cobalt, nickel, or alloys thereof.

5. A method of forming a microelectronic interconnection, comprising:
    providing a substrate having at least one solder interconnect bump formed thereon;
    providing a microelectronic device having at least one magnetic attachment structure formed thereon, wherein the at least one magnetic attachment structure is formed by forming a metal component and plating alternating layers of a magnetic component and metal component layers on a top surface of the metal component;
    heating the magnetic attachment structure in a magnetic field; and
    contacting the at least one magnetic attachment structure with the solder interconnect bump.

6. The method of claim 5, wherein heating the magnetic attachment structure comprises heating the magnetic attachment structure with an alternating current magnetic field imparted on the magnetic attachment structure.

7. The method of claim 5, wherein heating the magnetic attachment structure comprises heating the magnetic attachment structure to at least a reflow temperature of the solder material.

8. The method of claim 5, wherein plating the magnetic component on at least one surface of the metal component comprises plating a magnetic component comprising iron, cobalt, nickel, or alloys thereof.

9. A method of forming an interconnection, comprising:
    forming a magnetic attachment structure comprising forming a metal component and plating alternating layers of a magnetic component and metal component layers on a top surface and at least one sidewall of the metal component;
    heating a magnetic attachment structure in a magnetic field;
    contacting a solder material with the heated magnetic attachment structure; and
    attaching the magnetic attachment structure to the solder material by removing the magnetic field.

10. The method of claim 9, wherein heating the magnetic attachment structure comprises heating the magnetic attachment structure with an alternating current magnetic field imparted on the magnetic attachment structure.

11. The method of claim 9, wherein heating the magnetic attachment structure comprises heating the magnetic attachment structure to at least a reflow temperature of the solder material.

12. The method of claim 9, wherein plating the magnetic component on at least one surface of the metal component comprises plating a magnetic component comprising iron, cobalt, nickel, or alloys thereof.

13. A method of forming a microelectronic interconnection, comprising:
    providing a substrate having at least one solder interconnect bump formed thereon;
    providing a microelectronic device having at least one magnetic attachment structure formed thereon, wherein the at least one magnetic attachment structure is formed by forming a metal component and plating alternating layers of a magnetic component and metal component layers on a top surface and at least one sidewall of the metal component;
    heating the magnetic attachment structure in a magnetic field; and
    contacting the at least one magnetic attachment structure with the solder interconnect bump.

14. The method of claim 13, wherein heating the magnetic attachment structure comprises heating the magnetic attachment structure with an alternating current magnetic field imparted on the magnetic attachment structure.

15. The method of claim 13, wherein heating the magnetic attachment structure comprises heating the magnetic attachment structure to at least a reflow temperature of the solder material.

16. The method of claim 13, wherein plating the magnetic component on at least one surface of the metal component comprises plating a magnetic component comprising iron, cobalt, nickel, or alloys thereof.

* * * * *